(12) United States Patent
Haase et al.

(10) Patent No.: US 8,835,963 B2
(45) Date of Patent: Sep. 16, 2014

(54) LIGHT CONVERTING AND EMITTING DEVICE WITH MINIMAL EDGE RECOMBINATION

(75) Inventors: Michael A. Haase, St. Paul, MN (US); Junqing Xie, Woodbury, MN (US); Thomas J. Miller, Woodbury, MN (US); Terry L. Smith, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/701,065

(22) PCT Filed: May 25, 2011

(86) PCT No.: PCT/US2011/037845
§ 371 (c)(1),
(2), (4) Date: Nov. 30, 2012

(87) PCT Pub. No.: WO2011/153034
PCT Pub. Date: Dec. 8, 2011

(65) Prior Publication Data
US 2013/0075774 A1    Mar. 28, 2013

Related U.S. Application Data

(60) Provisional application No. 61/351,566, filed on Jun. 4, 2010.

(51) Int. Cl.
*H01L 33/00* (2010.01)
*H01L 33/50* (2010.01)
*H01L 33/36* (2010.01)

(52) U.S. Cl.
CPC .............. *H01L 33/36* (2013.01); *H01L 33/005* (2013.01); *H01L 33/50* (2013.01)

USPC .................. 257/98; 257/79; 257/88; 257/89; 257/99

(58) Field of Classification Search
None
See application file for complete search history.

(56) References Cited

U.S. PATENT DOCUMENTS

2007/0221867 A1* 9/2007 Beeson et al. ............. 250/487.1
(Continued)

FOREIGN PATENT DOCUMENTS

| WO | WO 2009/148717 A2 | 12/2009 |
| WO | WO 2010/027650 A1 | 3/2010 |
| WO | WO 2011/153141 A2 | 12/2011 |
| WO | WO 2011/153153 A2 | 12/2011 |

OTHER PUBLICATIONS

International Application PCT/US2011/037845 Search Report dated Aug. 6, 2011.
(Continued)

*Primary Examiner* — Kyoung Lee
(74) *Attorney, Agent, or Firm* — Yufeng Dong; Jay R. Pralle; Daniel J. Iden (57) ABSTRACT

Light emitting system (100), particularly, light emitting systems that utilize semiconductor wavelength converting regions (104), and methods of producing such systems are disclosed. The light emitting systems and methods of producing such systems seek to frustrate recombination of free carriers that are associated with wavelength converting regions.

27 Claims, 5 Drawing Sheets

(56) References Cited

U.S. PATENT DOCUMENTS

| | | |
|---|---|---|
| 2008/0142816 A1 | 6/2008 | Bierhuizen |
| 2009/0072263 A1 | 3/2009 | Paolini |
| 2009/0309114 A1* | 12/2009 | Lu et al. .......... 257/98 |
| 2010/0038665 A1* | 2/2010 | Sugiura et al. .......... 257/98 |
| 2010/0051898 A1 | 3/2010 | Kim |
| 2010/0084675 A1* | 4/2010 | Ueno et al. .......... 257/98 |
| 2010/0117997 A1 | 5/2010 | Haase |

OTHER PUBLICATIONS

International Application PCT/US2011/037845 Written Opinion of the International Searching Authority dated Aug. 26, 2011.
U.S. Appl. No. 61/351,566 to Haase et al., filed Jun. 4, 2010, entitled *Light Converting and Emitting Device With Minimal Edge Recombination*.

\* cited by examiner

LIGHT CONVERTING AND EMITTING DEVICE WITH MINIMAL EDGE RECOMBINATION

CROSS REFERENCE TO RELATED APPLICATIONS

This application is a national stage filing under 35 U.S.C. 371 of PCT/US2011/037845, filed May 25, 2012, which claims priority to U.S. Provisional Application No. 61/351,566, filed Jun. 4, 2010, the disclosure of which is incorporated by reference in its/their entirety herein.

FIELD

This invention generally relates to light emitting systems. Particularly, this invention relates to light emitting systems that utilize wavelength converting regions, and methods of producing such systems.

BACKGROUND

Illumination systems are used in many different applications, including projection display systems, backlights for liquid crystal displays and the like. Often, projection systems use one or more white light sources, such as high pressure mercury lamps. However, increasingly, light emitting diodes (LEDs) have been considered as alternatives to other white light sources. LEDs have the potential to provide the brightness and operational lifetime that would compete with conventional light sources. Current LEDs, however, especially green emitting LEDs, are relatively inefficient.

Because of this inefficiency, wavelength converted light emitting diodes (LEDs) are becoming increasingly important for illumination applications where there is a need for light of a color that is not normally generated by an LED, or where a single LED may be used in the production of light having a spectrum normally produced by a number of different LEDs together.

One approach to generating white light with a single LED is to first generate blue light with the LED and then to convert some or all of the blue light to a different color or colors. For example, a portion of the blue light may be converted to red light, and a portion of the blue light may be converted to green light, such that the resultant output light, when mixed, is white. The light correcting process can result in recombination of free carriers at the surface of the converting layer. Such recombination can lead to degradation of the semiconductor and reliability issues. It would therefore be desirable to have a wavelength converted light emitting diode (LED) that addresses these surface recombination issues to provide for more reliable and improved performance.

SUMMARY

One embodiment in this description is directed to a light emitting system that has an electroluminescent pump light source. The pump light source emits light of a first wavelength toward a semiconductor light converting construction and a non-light converting area. The semiconductor light converting construction absorbs light of the first wavelength and emits light of a second wavelength, and the non-light converting area does not convert light wavelengths. The light emitting system also has a light-blocking structure positioned between the emission surface of the electroluminescent device and the edge of the semiconductor light converting construction. The light blocking structure may, in some embodiments, reduce recombination of free carriers at the edge of the first semiconductor light converting construction by blocking pump light from reaching the edge of the construction near the surface.

In another embodiment, the description is related to a method of making a lighting emitting system. The method includes providing an LED, where the LED has a plurality of electrodes on an emitting surface. The method further requires bonding a wavelength converter layer onto the emission surface and electrodes of the LED. Further, the method requires removing a portion of the wavelength converter to create an edge of the wavelength converter layer expose at least a portion of an electrode in the plurality of electrodes, such that the electrode inhibits light from the emission surface of the LED from reaching an edge of the wavelength converter layer.

DETAILED DESCRIPTION

Wavelength converting LEDs are becoming increasingly popular in a variety of lighting applications. One common issue with wavelength converting LEDs using semiconductor color converters, however, is the non-radiative recombination of charge carriers at the free surfaces of light converting layers. The present description provides a solution to certain surface recombination issues by illustrating a light emitting system with reduced surface recombination. The description therefore provides for a wavelength converting LED with greater reliability, efficiency, and improved performance.

Figure 1:
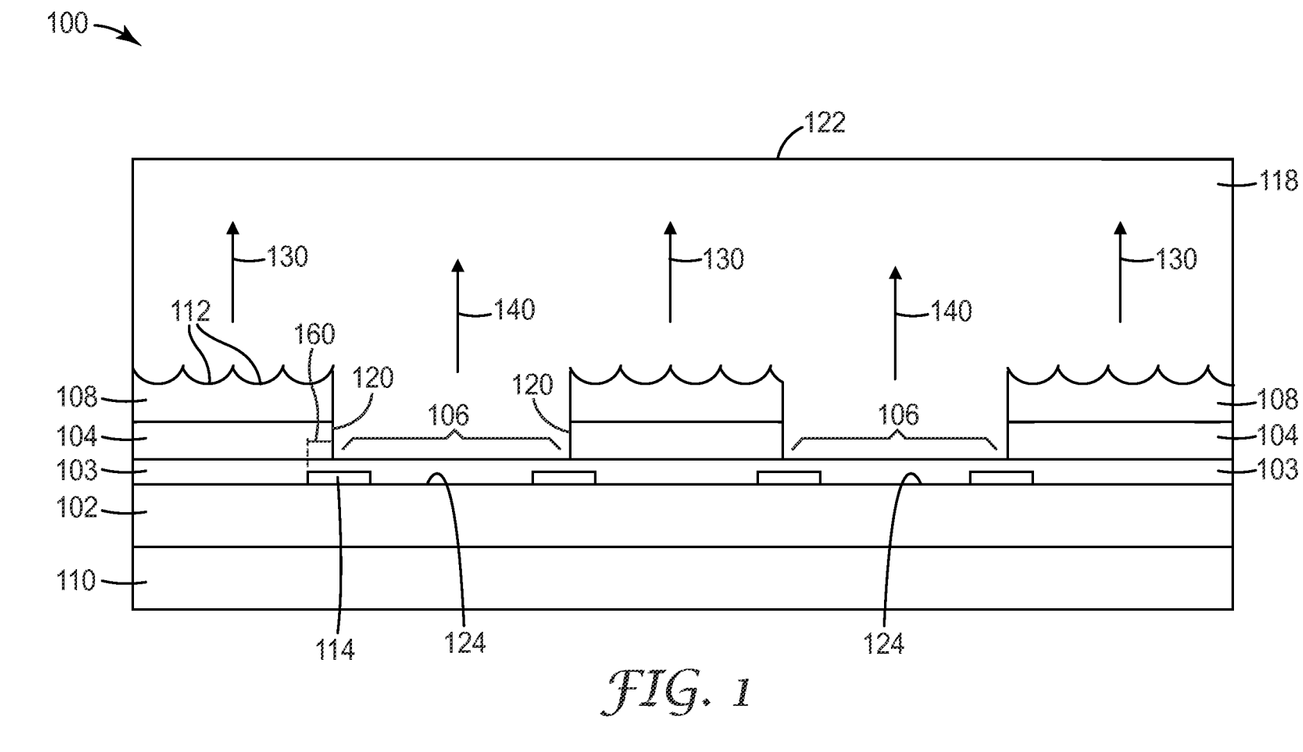
FIG. 1 illustrates a cross-sectional view of a light emitting system.

One embodiment of the currently description is illustrated in FIG. 1. Specifically, FIG. 1 provides a light emitting system 100. The light emitting system is made up in part of an electroluminescent device 102. The electroluminescent device 102 serves as the source of light for the light emitting system. More specifically, the electroluminescent device emits a pump light at a first wavelength $\lambda_1$. Any number of pump light wavelengths are contemplated. In one embodiment, the pump light will be blue light, or described otherwise, $\lambda_1$ will be between about 425 nm and 475 nm.

Herein, reference to light at a wavelength $\lambda$ is meant to indicate that the centroid of the spectrum of the light is at the wavelength $\lambda$.

Light of the first wavelength $\lambda_1$ may generally exit the electroluminescent device 102 and enter one of two separate types of regions. Part of the pump light enters a first semiconductor light converting construction 104. This semiconductor light converting construction 104 may be attached to the electroluminescent device 102 by an optical adhesive 103. The first semiconductor light converting construction 104 absorbs pump light of wavelength $\lambda_1$. The first semiconductor light converting construction then emits light of a second wavelength $\lambda_2$ that is longer than wavelength $\lambda_1$. In some cases for example, the semiconductor light converting construction may absorb blue pump light, or light having a wavelength of between about 425 nm and 475 nm, in what may be understood as a blue region of the visible spectrum. The construction 104 may then emit some light that is red in color, or light having a wavelength ($\lambda_2$) of between about 600 nm and 650 nm, in what may be understood as a red region of the visible spectrum. A portion of the pump light at the first wavelength $\lambda_1$ also may travel through the semiconductor light converting construction.

In some embodiments, light may exit the first semiconductor light converting construction 104 directly into an overcoat region 118. As illustrated in FIG. 1, the overcoat region 118 spans across the entire light emitting system. The overcoat 118 enhances extraction of light from the semiconductor light converting construction. In some cases, the overcoat can include glassy materials or metal oxides, such as $Al_2O_3$, $TiO_2$, $ZrO_2$, $La_2O_3$, $Ta_2O_5$, $HfO_2$, silicate, silicon nitride, silicon oxynitride, or indium-tin oxide. In some cases, the overcoat can be a semiconductor overcoat, such as an overcoat containing ZnS, ZnSe, ZnO or a semiconductor alloy such as $ZnS_xSe_{1-x}$. In some cases, the overcoat can be a sol-gel, such as a densified sol-gel. In some cases, the index of refraction of the overcoat is greater than the index of refraction of the outermost layer in the semiconductor light converting construction. In some cases, the overcoat can include at least one of $Si_3N_4$, silicon oxynitride, silicate, ZnS, ZnSe, ZnTe, ZnSSe, ZnSeTe, ZnSTe, CdS, CdSe, CdSSe, ITO, $TiO_2$, $ZrO_2$, $Ta_2O_5$, and $HfO_2$. In some cases, overcoat 118 can be a discontinuous layer by, for example, including one or more islands. In some cases, as illustrated in FIG. 1, overcoat 118 can be a continuous layer.

In other embodiments, however, rather than enter directly into the overcoat region 118, the light that exits the first semiconductor light converting construction 104 of both the first wavelength $\lambda_1$, and the second wavelength $\lambda_2$, enters a second semiconductor light converting construction 108. The second semiconductor light converting construction 108, like the first semiconductor light converting construction 104 absorbs the pump light of wavelength $\lambda_1$. The second semiconductor light converting construction then emits light of a third wavelength $\lambda_3$ that is different from $\lambda_1$ and $\lambda_2$. In some cases for example, the second semiconductor light converting construction may absorb blue pump light, or light having a wavelength of between about 425 nm and 475 nm. The construction 108 may then emit some light that is green in color, or light having a wavelength ($\lambda_3$) of between about 525 nm and 555 nm, in what may be understood as the green region of the visible spectrum. A portion of light at the first wavelength $\lambda_1$ also may travel through the second semiconductor light converting construction unconverted. In addition, light of the second wavelength $\lambda_2$, which may, for example, be red light, may travel through the second semiconductor light converting construction unconverted. Therefore light of the second wavelength $\lambda_2$, the third wavelength $\lambda_3$ and even a small amount of unconverted pump light of the first wavelength $\lambda_1$ may exit the second semiconductor light converting construction.

Besides the overcoat region 118, other measures are contemplated to further aid in enhancing light extraction from the semiconductor light converting constructions. One such measure is illustrated by extraction features 112 formed into the second semiconductor light converting construction 108. Such features may also be etched into first semiconductor light converting construction whether a second semiconductor light converting construction is present or not in the system. In general, light can be extracted by any means suitable in an application. For example, light can be extracted by encapsulation where the encapsulating element can, for example, have a hemispherical profile. Light can also be extracted by patterning or texturing, for example roughening, the top and/or lower surfaces of one or more layers in the semiconductor light converting construction.

The part of the pump light that exits the electroluminescent device 102 and impinges on a first semiconductor light converting construction is largely converted to light of a second wavelength $\lambda_2$ and potentially to light of a third wavelength $\lambda_3$ in some embodiments, while the remainder of the pump light travels through non-light converting areas 106. The non-light converting areas are placed in between each of the first semiconductor light converting constructions (and potentially second semiconductor light converting constructions) periodically. At least a portion of each non-light converting area will border on a portion of an edge of a light converting area 120. The non-light converting area may be made up of any number of materials, provided that the materials do not serve to convert the pump light of the first wavelength $\lambda_1$ to a different wavelength light. In one embodiment, the non-light converting area may be made of the same material as the overcoat region 118. Such a construction is illustrated in FIG. 1. However, the non-light converting area may also be a material that is different from the overcoat region. According to this construction, light 130 may be emitted from the first semiconductor light converting construction primarily at second wavelength $\lambda_2$ and partially at pump light wavelength $\lambda_1$, and light 140 of pump wavelength $\lambda_1$ is emitted through the non-light converting area without being converted. Where a second semiconductor light converting construction is present, again light 140 of pump wavelength $\lambda_1$ is emitted through the non-light converting area, while light 130 may be emitted from first and second semiconductor light converting constructions primarily at second wavelength $\lambda_2$ and third wavelength $\lambda_3$, and partially at pump light wavelength $\lambda_1$. Light 130 and 140 of generally different colors may then mix to a fair degree before being emitted from the surface of the overcoat region 122. In the case where blue, red and green light correspond to $\lambda_1$, $\lambda_2$, and $\lambda_3$ respectively, light may exit surface 122 as white or near-white light.

The electroluminescent device may be located on top of a substrate 110. Substrate 110 can include any material that may be suitable in an application. For example, substrate 110 may include or be made of Si, Ge, GaAs, GaN, InP, sapphire, SiC and ZnSe. In some cases, substrate 110 may be n-doped, p-doped, insulating, or semi-insulating, where the doping may be achieved by any suitable method and/or by inclusion of any suitable dopant.

In some cases, light emitting system 100 does not include a substrate 110. For example, various elements of light emitting system 100 may be formed on substrate 110 and then separated from the substrate by, for example, etching or ablation.

While the semiconductor light converting constructions and non-light converting areas along the electroluminescent device serve to provide a mix of color for the light source, concerns may arise with respect to the edge 120 of the semiconductor light converting constructions. The primary concern is that charge carriers that are photogenerated near the edge of the construction may diffuse to the edge 120 and recombine non-radiatively. This leads to degradation of the semiconductor near the edge 120 and lowers reliability and efficiency. It has been discovered, however, that positioning a light blocking structure 114 in specific positions aids in substantially limiting the number of photogenerated carriers near the edge 120, thus greatly reducing the amount of surface recombination, and increasing performance. As shown in FIG. 1, the light emitting system may be made up in part of a plurality of light blocking structures. Each light blocking structure may be located beneath an edge 120 of a light converting construction 104. It should be noted that although the light blocking structure may still be covered by adhesive layer 103, the structure 114 may be understood as partially exposed, if at least a portion of the structure 114 is not beneath the light converting construction 104. Of course, the adhesive layer 103 may be stripped away as well on the exposed portion of the light blocking structure.

Figure 2A:
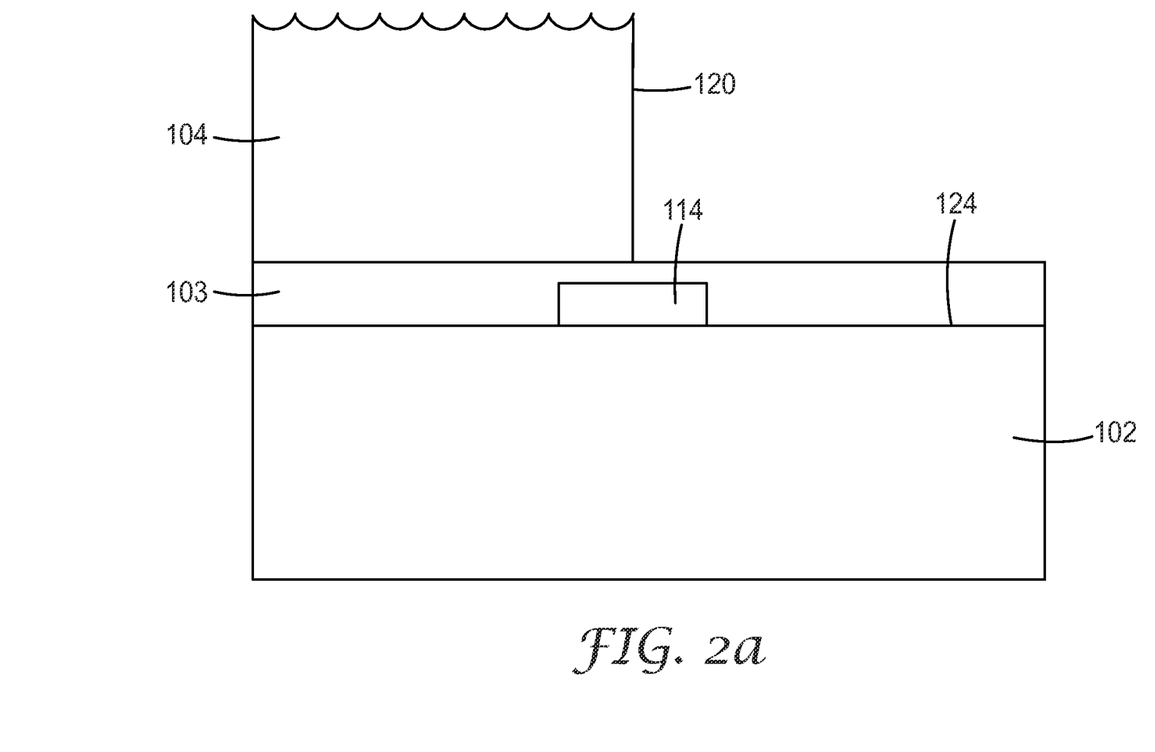
FIGS. 2a-c illustrate cross-sectional views of a portion of a light emitting system with varying structure positions.
Figure 2B:
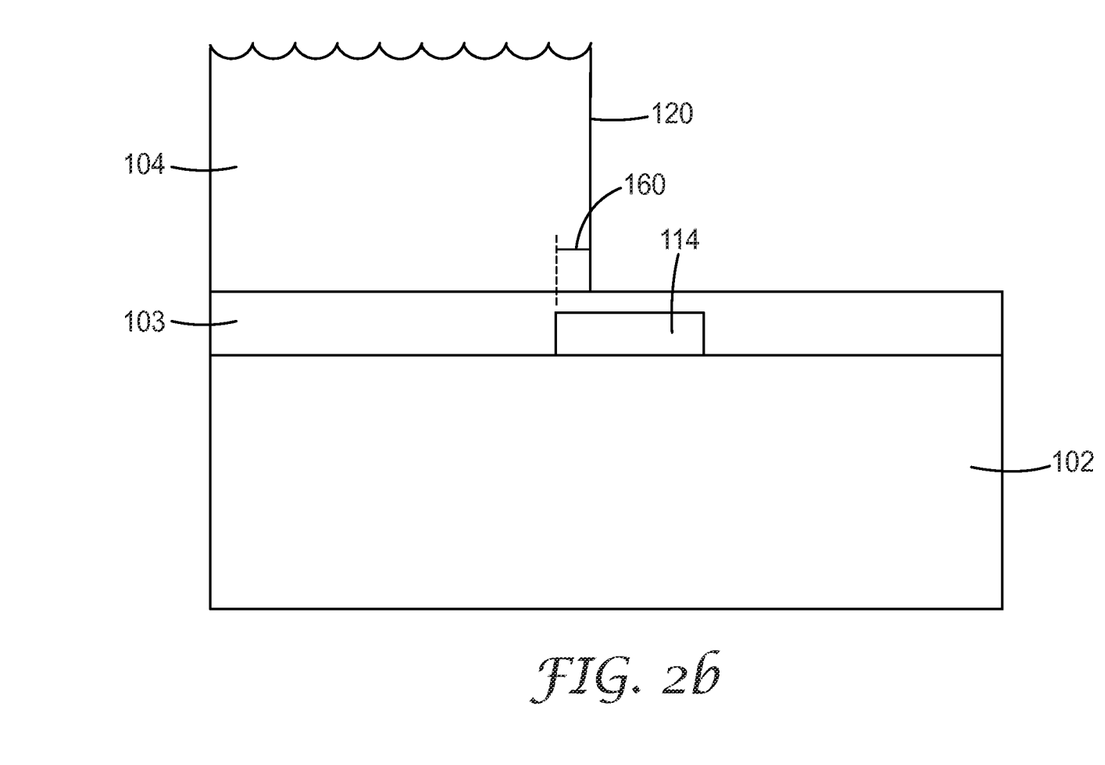
Figure 2C:
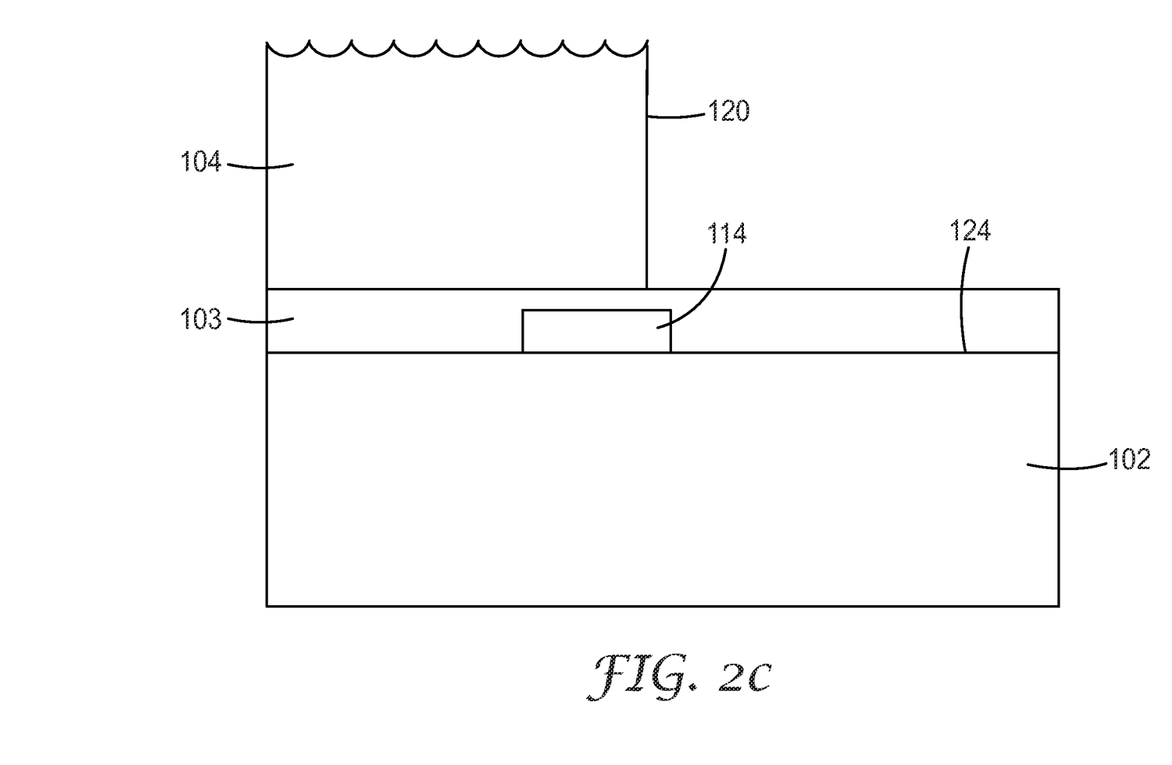

Light blocking structure 114 may be placed between the emission surface 124 of the electroluminescent device 102 and the edge 120 of the first (or first and second) semiconductor light converting construction 104. In other words, the edge 120 of the first (or first and second) semiconductor light converting structure is placed over the light blocking structure. In general, the light blocking structure 114 may be located in a range of positions. FIGS. 2a-2c illustrate exemplary positions of the structure with respect to an edge of the semiconductor light converting construction. For example, FIG. 2a illustrates an embodiment in which the light blocking structure 114 is located with half of its area covered by the semiconductor light converting construction 104 and half beneath the non-light converting area, surrounded by optical adhesive 103. Light blocking structure inhibits light from the emission surface 124 of the electroluminescent device 102 from reaching the edge 120 of the semiconductor light converting construction 104, thereby reducing photogenerated carriers near the edge, and surface recombination at the edge.

In at least some embodiment, the light blocking structure 114 should be understood as shadowing at least a portion of the edge 120 of first semiconductor light converting construction from the pump light emitted from LED 102. In certain embodiments, the light blocking structure 114 may shadow the entire edge 120 of the construction 104, in order to prevent degradation. Shadowing may be understood as blocking pump light from reaching the surface.

In FIG. 2b, the light blocking structure 114 is located such that only a minority of its surface is located beneath the light converting area 104 (surrounded by optical adhesive 103). The structure serves to block pump light leaving emission surface 124 of electroluminescent device 102 from reaching the edge 120. FIG. 2c illustrates a light blocking structure 114 with a majority of its area covered by the semiconductor light converting construction 104. Only a small portion of the structure 114 is beneath the non-light converting area (surrounded by optical adhesive 103), but it is still capable of blocking light emitted from surface 124 of electroluminescent device 102 from reaching edge 120. Both of the constructions in FIGS. 2b and 2c are contemplated embodiments according to this description. However, it should be noted, especially with regard to FIG. 2b that the lateral surface amount of the face of electrode 160 that is under the light converting area should be at least of a certain length. Specifically, the face of the structure 114 should extend under the converting area by a lateral distance of at least one minority carrier diffusion length in the semiconductor material from which the converting layer is made, for example a II-VI material. This distance is required to minimize the number of free carriers reaching the edge of the semiconductor light converting construction.

As noted, the light blocking structure may be placed between the emission surface of the electroluminescent device and the edge of a semiconductor light converting construction. The light blocking structure may be in close proximity to the electroluminescent device. In some embodiments, the light blocking structure may be in direct contact with the electroluminescent device. In some embodiments, the light blocking structure may be mechanically coupled to the electroluminescent device.

In at least one embodiment the light blocking structures 114 are electrodes. Such electrodes may be positioned on the surface of the electroluminescent device and serve to draw current through the electroluminescent device to generate light. In other words, the electrodes may not only function to block light but also function to bias the electroluminescent device or provide some electrical function.

In the case where light blocking structures 114 are electrodes, a variety of suitable materials may be used. The electrodes may be made of any suitable material known in the art, including but not limited to metals, or metal alloys including: gold, silver, aluminum, nickel, titanium, chromium, platinum, palladium, rhodium, rhenium, ruthenium, tungsten, indium and mixtures and alloys of such. Electrodes may typically be driven by an external controller that is connected by wiring. Electrodes may also be understood as being in electrical contact with the electroluminescent device. For instance, the electrodes may be in a closed electrical circuit with the electroluminescent device. In the case where light blocking structure 114 is an electrode, semiconductor light converting construction(s) 104 (and 108) may be selectively etched away to allow for bonding to the appropriate portion of the electrode. Where adhesive layer 103 is present, this may also be etched away to allow for bonding.

Other light blocking structures 114 are also contemplated. So long as the structure is opaque to light traveling through the construction and therefore blocks light at the surface of the semiconductor light converting construction, it will provide the desired effect. However, the structure may also be chosen based upon further desirable mechanical, optical, or electrical properties.

In general, first and/or second semiconductor light converting constructions can include any element or material capable of converting at least a portion of the light at one wavelength to light at a different wavelength. For example, the construction 104 or 108 can include a semiconductor potential well, a quantum well, or multiple of each.

As used herein, potential well means semiconductor layer(s) in a multilayer semiconductor structure (or semiconductor light converting construction) designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less.

In some cases, a potential or quantum well includes a II-VI semiconductor potential or quantum well that has a transition energy $E_{pw}$ that that is smaller than the energy $hv_1$ of a photon emitted by electroluminescent device. In general, the transition energy of a potential or quantum well is substantially equal to the energy $hv_2$ of a photon that is re-emitted by the potential or quantum well.

As noted, in certain embodiments, the first and/or second semiconductor light converting constructions may include one or more potential wells made up of semiconductor materials in the II-VI family of materials. In some cases, the potential well can include CdMgZnSe alloys having compounds ZnSe, CdSe, and MgSe as the three constituents of the alloy. In some cases, one or more of Cd, Mg, and Zn, especially Mg, may be absent from the alloy. For example, the potential well can include a $Cd_{0.70}Zn_{0.30}Se$ quantum well capable of re-emitting in the red, or a $Cd_{0.33}Zn_{0.67}Se$ quantum well capable of re-emitting in the green. As another example, a potential well can include an alloy of Cd, Zn, Se, and optionally Mg, in which case, the alloy system can be represented by Cd(Mg)ZnSe. As another example, a potential well can include an alloy of Cd, Mg, Se, and optionally Zn. In some cases, the potential well can include ZnSeTe. In some cases, a quantum well has a thickness in a range from about 1 nm to about 100 nm, or from about 2 nm to about 35 nm.

Other embodiments of the semiconductor light converting constructions may include III-V semiconductors such at AlGaInP, AlGaAs or AlGaInN.

In general, potential wells can have a variety of conduction and/or valence band profiles. Exemplary profiles are described in, for example, U.S. Patent Application No. 60/893,804.

In some cases, potential wells can be n-doped or p-doped where the doping can be accomplished by any suitable method and by inclusion of any suitable dopant. In some cases, the electroluminescent device and a potential well can be from two different semiconductor groups. For example, in such cases, the electroluminescent device 102 can be a III-V semiconductor device and the potential well can be a II-VI potential well. In some cases, electroluminescent device 102 can include AlGaInN semiconductor alloys and the potential well can include Cd(Mg)ZnSe semiconductor alloys where a material enclosed in parentheses is an optional material.

In general, semiconductor light converting construction 104 and/or 108 can have one or more potential wells. In some cases, constructions 104 and/or 108 can have multiple potential wells. For example, in such cases, construction 104 and/or 108 can have at least 2 potential wells, or at least 5 potential wells, or at least 10 potential wells. In some cases, construction 104 and/or 108 can have at least two potential wells, or at least three potential wells, or at least four potential wells, with different transition energies.

Figure 3:
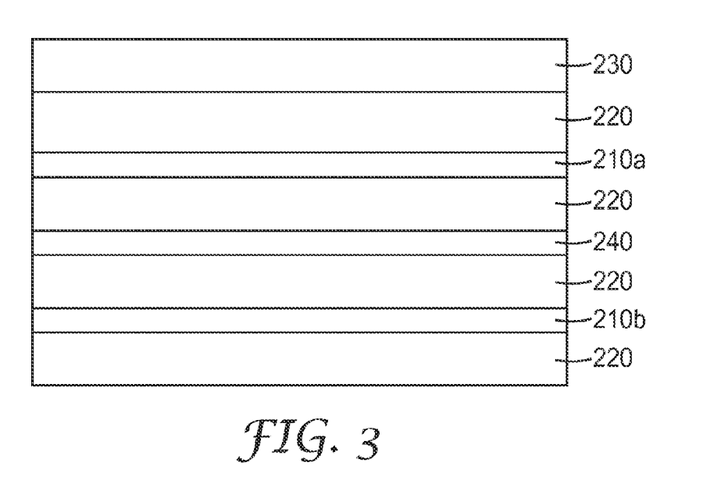
FIG. 3 illustrates a cross-sectional view of the layers of an exemplary semiconductor light converting construction.

In order to understand better the semiconductor light converting construction, one may reference FIG. 3. Here potential wells 210 are located throughout the construction. In this case, potential wells 210a may be understood as converting light from a first wavelength $\lambda_1$ to a second wavelength $\lambda_2$ and potential wells 210b may be understood as converting light from a first wavelength $\lambda_1$ to a third wavelength $\lambda_3$. In general, however, semiconductor light converting constructions may also have one or more layers that are non-potential well layers. One particularly useful type of non-potential well layers is an absorbing layer 220. In fact, in one exemplary semiconductor light converting construction, the construction may be made of alternating layers of potential well layers 210a or 210b and absorbing layers 220. The absorbing layers 220 aid in absorbing light of the pump wavelength, or first wavelength $\lambda_1$ that is not converted to a second or third wavelength, $\lambda_2$ or $\lambda_3$ by the potential well layers. The amount, and thickness of absorbing layers 220 used may depend upon the desired color balance to be achieved from light emitted out of the semiconductor light converting construction. Absorbing layers 220 at different positions in the stack also may be tuned to absorb light of different wavelengths. Therefore, layers 220 in FIG. 3 may have different absorptive properties depending upon whether they are placed proximate the red light converting region 210a or green light converting region 210b. In addition, although such layers are not themselves light converting, they may also aid in light conversion by creating photo-generated electron-hole pairs that diffuse from the absorbing layers into the potential wells. This is why it is beneficial to have light absorbing layers 220 placed proximate the potential wells 210a and 210b.

The stack may also be understood as including a window layer 230. The window layer may be present at an entrance to the stack abutting, in the illustrated figure, absorbing layer 220. Window layers may also be placed on the opposite side of the stack. Window layers are provided to provide high energy band barriers so that free carriers that are photo-generated in an absorbing layer and/or potential well have no, or very little, chance to diffuse to a free or an external end surface of the stack.

In some situations, it may be desirable to control the diffusion of photogenerated carriers between absorber layers by including internal barrier layers. For example, a barrier layer 240 may be placed between a red converting potential well and green converting potential well (as illustrated in FIG. 3). In such a case free carriers from absorber layers adjacent the green potential well 210b are not allowed to diffuse through the construction towards the red potential well 210a, but rather are forced to recombine in the green potential well 210b or move towards the surface. Barrier layer 240 achieves this because its band gap energy is greater than that of the absorption layer and greater than the potential well in the blocked region, 210b.

Electroluminescent device 102 can be any device capable of emitting light in response to an electrical signal. For example, an electroluminescent device can be a light emitting diode (LED) or a laser diode capable of emitting photons in response to an electrical current. An LED electroluminescent device 102 can emit light at any wavelength that may be desirable in an application. For example, the LED can emit light at a UV wavelength, a visible wavelength, or an IR wavelength. In general, the LED can be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

In some cases, electroluminescent device 102 can include one or more p-type and/or n-type semiconductor layers, one or more active layers that may include one or more potential and/or quantum wells, buffer layers, substrate layers, and superstate layers. In some cases, electroluminescent device 102 can be a III-V semiconductor light source, such as a III-V LED, and may include AlGaInN semiconductor alloys. For example, electroluminescent device 102 can be a GaN based LED. As another example, electroluminescent device 102 can be a II-VI LED, such as a ZnO based LED.

Figure 4:
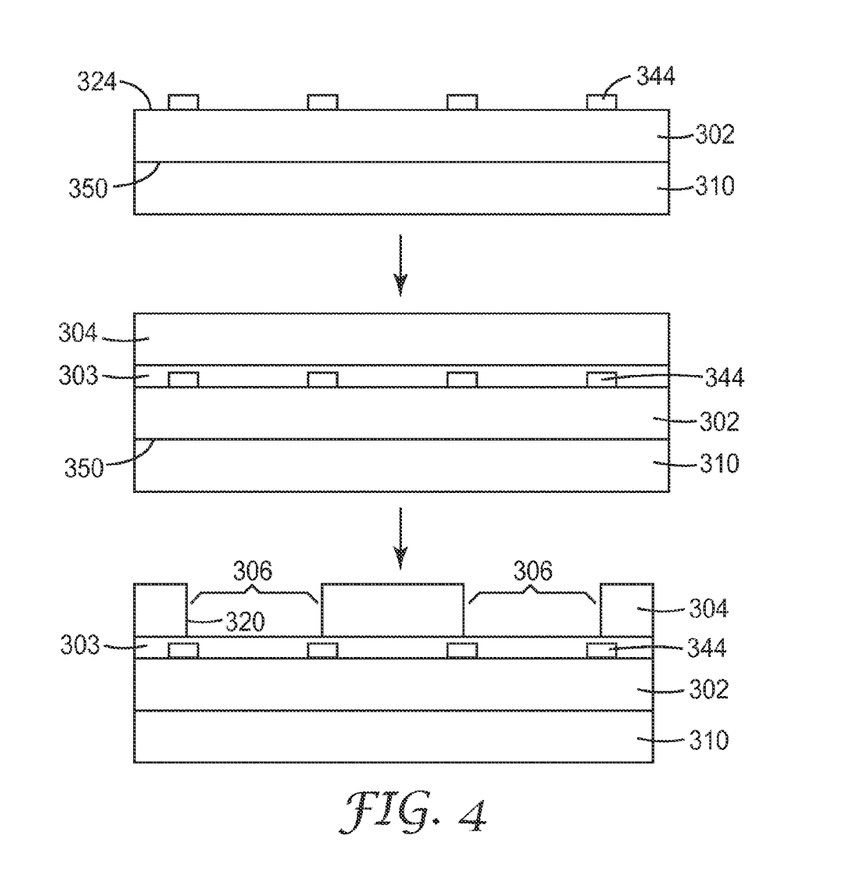
FIG. 4 is a flow-chart of a method for producing a light emitting system according to the current description.

In another aspect, the present description relates to a method of making a light emitting system. FIG. 4 provides a step-by-step illustration of the method for making light emitting systems according to the current description. Referencing FIG. 4, the first step in the process is to provide an LED 302 with an emission surface 324. In at least some embodiments, the LED 302 and subsequent layers are grown on a growth substrate 310 at interface 350 as illustrated in FIG. 4. The LED includes a plurality of electrodes 344 on the emission surface 324. Note that in the articles of FIGS. 1 and 2a-c, an opaque light blocking structure 114 is disclosed that may in fact be an electrode. In the method described herein, an electrode is specifically disclosed, and is labeled as element 344. In the next step, a wavelength converter layer 304 is disposed onto the emission surface 324 of the LED. The step of disposing may include, for example, bonding the converter layer to the LED using, for example, an optical adhesive layer 303. In the third step a portion of the wavelength converter layer 304 is removed to create an edge of the converter layer and expose at least a portion directly above an electrode 344 in the plurality of electrodes. This may result in part of the electrode being covered by converter layer 304 and part of the electrode being exposed (except for the adhesive layer 303). This removal may be accomplished by etching away part of the wavelength converter layer 304. One particularly useful method of etching for this step may be photolithography followed by wet etching. In some cases, appropriate dry etching techniques may also be used. This removal results in an aperture (or non-light converting area) 306 in the wavelength converter 304, where the aperture may also be understood as a non-light converting area. The electrode 344 serves to inhibit light from reaching an edge of the wavelength converter layer from the emission surface 324 of the LED. The electrode 344 may shadow a portion of the edge 320 of light converting construction 304. In some embodiments the electrode 344 may shadow the entire edge 320 of the construction 304. It is to be understood that the steps associated with this method may be performed sequentially as explained above, or in a different sequence.

In another step, not illustrated in FIG. 4, a growth substrate 310 may be removed from the converter layer 304. This removal can be achieved by etching, and in particular, in some cases, by selective wet etching until reaching surface 350. In some cases, appropriate dry etching techniques may be used for all or a portion of the removal step as well. Another potential step in some embodiments of the current method may involve etching light extraction features into the wavelength converter layer. Such extraction features may correspond to the features 112 discussed with respect to FIG. 1. Another potential step that may be included in the method is etching through the wavelength converter edge surface 320 at a position above a portion of the electrode 344. This step may allow for wire bonding to be achieved with the electrode, if such wire bonding is not already possible with the current exposure of the electrode. A further possible step may involve applying an overcoat region over the wavelength converter layer 304 and apertures (non-light converting areas) 306 on the side opposite from the electroluminescent device 302. The application may result in an article such as that pictured in FIG. 1, for example.

In addition, as also illustrated by the finished article in FIG. 1, the method may also include stacking a second wavelength converter layer (see 108 in FIG. 1) on top of the first wavelength converter layer. The second wavelength converter layer will convert light to a different wavelength than the first wavelength converter layer. The second layer may be stacked on the first layer before etching, as one continuous layer, or after etching, as discrete portions corresponding to each portion of the first converting layer remaining after creating the apertures or non-light converting areas 106.

The first and second wavelength converter layers may, as noted above, be made up of II-VI material, such as Cd, Zn, Se and optionally Mg. The electroluminescent device 102 may be made of any suitable semiconductor material for use in LEDs, for example, a III-IV semiconductor material The lateral surface amount of electrode 160 that remains covered by the wavelength converting layer after etching away the wavelength converting layer to create an aperture (or non-light converting area) should be at least of a certain length. Specifically, the covered upper face of the structure 114, in this case an electrode, should have a lateral distance of at least one minority carrier diffusion length in the II-VI material from which the converting layer is made. This distance is effective to ensure a very small number of photogenerated carriers diffuse to the etched edge, and therefore minimal surface recombination occurs at the edge.

We claim:
1. A light emitting system, comprising:
an electroluminescent device that emits a pump light of a first wavelength from an emission surface;
at least one first semiconductor light converting construction that absorbs the pump light and emits light of a second wavelength, the semiconductor light converting construction comprising an edge;
a non-light-converting area that does not convert the pump light into light of a different wavelength, wherein a first portion of the pump light impinges the first semiconductor light converting construction and a second portion of the pump light travels through the non-light-converting area; and
a light-blocking structure positioned between the emission surface of the electroluminescent device and the first semiconductor light converting construction, such that the edge of the first light converting semiconductor construction is positioned over the light blocking structure.

2. The light emitting system of claim 1, further comprising a plurality of light blocking structures and a plurality of first semiconductor light converting constructions, wherein each light blocking structure is positioned beneath an edge of a first light converting construction.

3. The light emitting system of claim 1, wherein the light-blocking structure is an electrode.

4. The light emitting system of claim 1, wherein the light-blocking structure is mechanically coupled to the emission surface.

5. The light emitting system of claim 1, further comprising an optical adhesive between the electroluminescent device and the first semiconductor light converting construction.

6. The light emitting system of claim 1, wherein the light-blocking structure reduces recombination of free carriers at the edge of the first semiconductor light converting construction.

7. The light emitting system of claim 1, further comprising at least a second semiconductor light converting construction that converts the pump light of the first wavelength into light of a third wavelength different than the second wavelength.

8. The light emitting system of claim 7, wherein at least a portion of the first and second semiconductor light converting constructions are stacked, such that light emitted from the first semiconductor light converting construction enters the second semiconductor light converting construction before being emitted, and further wherein the non-light converting area is adjacent to both the first semiconductor light converting construction and second semiconductor light converting construction.

9. The light emitting system of claim 8, further comprising absorbing layers stacked between the first and second semiconductor light converting constructions.

10. The light emitting system of claim 7, wherein the second semiconductor light converting construction is a potential well.

11. The light emitting system of claim 10, wherein the second semiconductor light converting construction is a II-VI semiconductor material.

12. The light emitting system of claim 7, wherein the third wavelength is in a red region of the spectrum.

13. The light emitting system of claim 7, wherein the first semiconductor light converting construction is a II-VI semiconductor material.

14. The light emitting system of claim 13, wherein the light-blocking structure extends under the edge of the first semiconductor light converting construction, the portion extending a distance of at least a minority carrier diffusion length of a free carrier in the II-VI material.

15. The light emitting system of claim 1, wherein the first wavelength is in a blue region of the spectrum.

16. The light emitting system of claim 1, wherein the second wavelength is in a green region of the spectrum.

17. The light emitting system of claim 1, wherein the first semiconductor light converting construction comprises a potential well.

18. The light emitting system of claim 1, wherein the non-light converting area is formed by removing a portion of the first semiconductor light converting construction.

19. The light emitting system of claim 1, wherein the light blocking structure shadows at least a portion of the edge of the first semiconductor light converting construction from the pump light of the first wavelength.

20. The light emitting system of claim 19, wherein the light blocking structure shadows the entire edge of the first semiconductor light converting construction from the pump light of the first wavelength.

21. A method of making a light emitting system, comprising the steps of:
providing an LED having an emission surface and a plurality of electrodes on the emission surface;
disposing a semiconductor wavelength converter layer onto the plurality of electrodes and the emission surface of the LED, wherein the wavelength converter layer is comprised of II-VI material; and
removing a portion of the wavelength converter layer to create an edge of the wavelength converter layer and expose at least a portion of an electrode in the plurality of electrodes, such that the at least partially exposed electrode inhibits light from the emission surface of the LED from reaching the edge of the wavelength converter layer.

22. The method of claim 21, further comprising the step of depositing the LED surface opposite the wavelength converter layer on a substrate.

23. The method of claim 22, further comprising the step of etching the substrate off of the LED.

24. The method of claim 21, wherein a portion of wavelength converter layer above the electrode that is not removed extends from the edge a distance of at least a minority carrier diffusion length in the II-VI material.

25. The method of claim 21, further comprising the step of etching over the electrodes to allow for wire bonding to the electrodes.

26. The method of claim 21, further comprising the step of disposing a second wavelength converter layer on top of the first wavelength converter layer, wherein the two wavelength converter layers convert light to at least two different wavelengths.

27. The method of claim 21, wherein the location of the edge is such that the electrode shadows at least a portion of the edge of the semiconductor wavelength converter layer.

* * * * *